United States Patent
Narayanan et al.

(10) Patent No.: US 7,519,898 B2
(45) Date of Patent: Apr. 14, 2009

(54) ITERATIVE DECODING OF LINEAR BLOCK CODES BY ADAPTING THE PARITY CHECK MATRIX

(76) Inventors: Krishna Rama Narayanan, 300 Augsburg La., College Station, TX (US) 77845; Jing Jiang, 700 Dominik Dr., Apt. 2201, College Station, TX (US) 77840; Nitin Ashok Nangare, Texas A&M University, 3128 TAMU, Mail Box #272, College Station, TX (US) 77843

( * ) Notice: Subject to any disclaimer, the term of this patent is extended or adjusted under 35 U.S.C. 154(b) by 677 days.

(21) Appl. No.: 11/089,486

(22) Filed: Mar. 24, 2005

(65) Prior Publication Data

US 2005/0229091 A1 Oct. 13, 2005

Related U.S. Application Data

(60) Provisional application No. 60/556,339, filed on Mar. 25, 2004.

(51) Int. Cl.
*G06F 11/00* (2006.01)
*H03M 13/00* (2006.01)

(52) U.S. Cl. .................. 714/801; 714/781; 714/784; 714/755; 714/786

(58) Field of Classification Search ................ 714/784, 714/801, 781, 786, 755
See application file for complete search history.

(56) References Cited

U.S. PATENT DOCUMENTS

| | | | |
|---|---|---|---|
| 5,563,897 | A | 10/1996 | Pyndiah et al. |
| 6,499,128 | B1 | 12/2002 | Gerlach et al. |
| 6,725,411 | B1 | 4/2004 | Gerlach et al. |
| 6,751,770 | B2 | 6/2004 | Morelos-Zaragoza |
| 7,058,873 | B2 * | 6/2006 | Song et al. .................. 714/752 |

* cited by examiner

*Primary Examiner*—Guy J Lamarre
(74) *Attorney, Agent, or Firm*—Robert P. Lenart, Esq.; Pietragallo Gordon Alfano Bosick & Raspanti, LLP

(57) ABSTRACT

A method of decoding linear block code uses an iterative message passing algorithm with a binary image of a parity check matrix of the linear block code, wherein the parity check matrix is adapted from one iteration to another based on the reliabilities of bits in the linear block code. The adaptation involves reducing a submatrix corresponding to the less reliable bits in the linear block code to a sparse nature before applying the message passing algorithm in each iteration. An apparatus that performs the method is also provided and several variations of the algorithm are also provided.

18 Claims, 4 Drawing Sheets

ITERATIVE DECODING OF LINEAR BLOCK CODES BY ADAPTING THE PARITY CHECK MATRIX

CROSS-REFERENCE TO RELATED APPLICATION

This application claims priority from U.S. Provisional Patent Application Ser. No. 60/556,339 filed on Mar. 25, 2004, and entitled "Iterative Decoding Of Linear Block Codes By Adapting The Parity Check Matrices," which is hereby incorporated by reference.

FIELD OF THE INVENTION

This invention relates to decoding of information bearing sequences, which occur in digital communication systems, and in particular, to a system and method for decoding information bearing sequences coded using linear block codes.

BACKGROUND OF THE INVENTION

In the field of digital data storage, data reliability is critical. Specifically, it is important that the user data that are retrieved from a medium match the data that were written to and stored on the medium. For a variety of reasons, the retrieved data may differ from the data that were originally stored. Any differences between the stored data and the retrieved data are considered errors in the data. Traditional methods for ensuring data reliability have included error detection and error correction. Typical error detection and correction techniques involve appending parity bits to the data during an encoding process to form a codeword prior to storage. When the codeword (data with parity bits) is later retrieved from the medium, it is decoded, and the parity bits are used to detect and correct errors. Essentially, the parity symbols provide redundancy, which may be used to check that the data were read correctly from the medium.

Digital data is typically partitioned into a number of symbols, each consisting of a fixed number of bits. For example, in the field of data storage, 8-bit symbols or "bytes" are commonly used. An m-bit symbol may be viewed as an element of a Galois field $GF(2^m)$, which is a finite field having unique mathematical properties. By treating the data as Galois field elements, mathematical operations may be performed on the symbols in a data storage device to reach useful results, including checking for errors. Error detection and correction algorithms, such as those used with the well-known Reed Solomon (RS) codes, take advantage of the mathematical properties of Galois fields. An error correction algorithm is able to correct up to a maximum number of symbol errors. The maximum number of symbol errors that the algorithm can correct is referred to as the "correction power" of the code. Error correction algorithms are able to correct errors primarily because a limited number of data blocks constitute the valid codewords that may be stored on the medium.

Typically, before user data is stored, it is first encoded with parity symbols for the sole purpose of error detection. These parity symbols are computed from the user data and the block of data consisting of the user data and the parity symbols forms a codeword in an error detection code (EDC). The parity symbols are referred to as EDC parity and the block of data together with its EDC parity is referred to as an EDC codeword.

In addition, the data and EDC parity may be encoded with additional parity symbols for the purpose of error correction. These parity symbols are computed from the user data and EDC parity and the block of data (including the user data, the EDC parity, and the additional parity symbols) to form a codeword in an error correction code (ECC). The additional parity symbols are referred to as ECC parity. The entire block of data together with its EDC parity and ECC parity is referred to as an ECC codeword.

Over the past 55 years, several classes of ECCs have been devised and are used widely in practice, examples of which include Hamming codes, convolutional codes, Bose Chaudhuri and Hocquenghem (BCH) codes, and Reed Solomon codes. For many classes of codes, such as the RS codes, the code symbols are viewed as elements of a Galois field and the codeword is viewed as a polynomial whose coefficients are the Galois field elements. The defining property of the code is that certain values of these polynomials are equal to zero. These codes are called "polynomial codes".

Recently, there has been a lot of interest in two other classes of ECC codes, namely, turbo codes and low density parity check (LDPC) codes. These codes and their variations which have sparse parity check matrices show appealing performance when decoded using an iterative message passing decoding algorithm. This decoding algorithm is also sometimes referred to as belief propagation. However, high rate LDPC or turbo codes of reasonable length usually exhibit an undesirable error floor in the high signal-to-noise (SNR) region due to their small minimum distance. Several research works have focused on the analysis of the error floor and the design of good codes with low error floors. In certain applications, when extremely low error rate is desired, codes with large minimum distances are still favorable. Therefore, in such applications (e.g. magnetic recording systems), Reed Solomon (RS) codes are employed due to their large minimum distances. RS codes are also widely used in many existing standards, such as optical recording, media transmission and satellite communication systems.

An optimal error correction algorithm applies a minimum distance rule, in which a block of data containing errors (an "invalid" or "corrupted" codeword) is changed to the "closest" valid codeword. This is referred to as "maximum likelihood decoding" because the decoder picks the codeword that is most likely to have resulted in the received sequence. However, for several classes of codes, such as for example RS codes, maximum likelihood decoding is computationally very complex and suboptimal decoders are normally used. A popular decoder is the Berlekamp Massey (BM) decoder which can be implemented in hardware efficiently. One of the major drawbacks of the BM decoder is that it is a hard decision decoder (HDD). That is, the received signal has to be quantized into one bit (zero or one) before it can be decoded. It is also possible to declare some bits as being 'erased' in addition to the one bit quantization, and such decoding is known as errors and erasure correcting. Although this is better than the HDD, it is still not as good as using many levels of quantization (possibly infinite). Such a decoder which uses many levels of quantization of the received signal is referred to as a soft decision decoder (SDD). It is commonly believed that a soft decision decoder provides nearly 2 to 3 dB gain over a hard decision decoder on an additive white Gaussian noise channel. Consequently, soft decision decoding of RS codes is of major theoretical and practical interest. In addition to being able to accept soft decisions, it is almost as important for the decoder to deliver soft outputs. This is particularly useful in concatenated systems where many decoders exchange information between them using the turbo principle. In such systems, the ability of the decoder to deliver good soft output greatly improves the overall performance.

Examples of such systems include turbo equalization, turbo demodulation, and turbo multiuser detection.

A few soft input soft output (SISO) RS code decoding methods are available in the literature, which can work for either short codes or codes with small minimum distances. Most of the currently popular soft decision decoding methods are list-decoding based soft input hard output (SIHO) algorithms, which include: enhanced algebraic hard decision decoding algorithm, such as, Chase decoding and generalized minimum distance (GMD) decoding, reliability based ordered statistics decoding (OSD) (and its variation: box and match (BMA) decoding) and more recently, the Koetter-Vardy (KV) decoding algorithm, which is an algebraic SIHO decoding algorithm. All these list-decoding based SIHO algorithms can improve the performance of RS codes over additive white Gaussian noise (AWGN) channels, but can be very complex computationally. When the computational complexity is limited, the performance improvement is only marginal and, hence, they do not achieve a good performance-complexity trade-off. Further, the generation of soft outputs involves averaging over all returned codewords in the list. Consequently, the list-decoder either generates too few codewords (e.g., Chase, GMD and KV) such that the soft outputs are unreliable (or doesn't contribute at all if no codeword is returned) or outputs too many codewords (e.g., OSD) such that averaging over the whole codeword list is computationally unaffordable.

An alternate approach to algebraic soft decoding is belief propagation (BP) based iterative decoding. Iterative decoding of linear block codes using the sum product algorithm (SPA) has been described by others. It is commonly believed that BP algorithms are not suitable for high density parity check codes (HDPC), such as RS codes, since the large number of short cycles in the Tanner graph will cause correlation between unreliable messages and consequently incur "error propagation".

Therefore, there is a need for a soft decision decoding technique for block codes such as RS codes that overcomes the limitations of previous techniques and provides good quality soft outputs.

SUMMARY OF THE INVENTION

This invention provides a method of decoding linear block code. The method comprises: using an iterative message passing algorithm with a binary image of a parity check matrix of the linear block code, wherein the parity check matrix is adapted from one iteration to another based on the reliabilities of bits in the linear block code. Particularly, a submatrix of the parity check matrix is reduced to a sparse nature before each iteration (including the first iteration) and this submatrix is chosen such that it corresponds to less reliable bits in the codeword.

In another aspect, the invention provides an apparatus comprising a decoder using an iterative message passing algorithm with a binary image of a parity check matrix of a linear block code, wherein the parity check matrix is adapted from one iteration to another based on the reliabilities of bits in the linear block code.

DETAILED DESCRIPTION OF THE INVENTION

Figure 1:
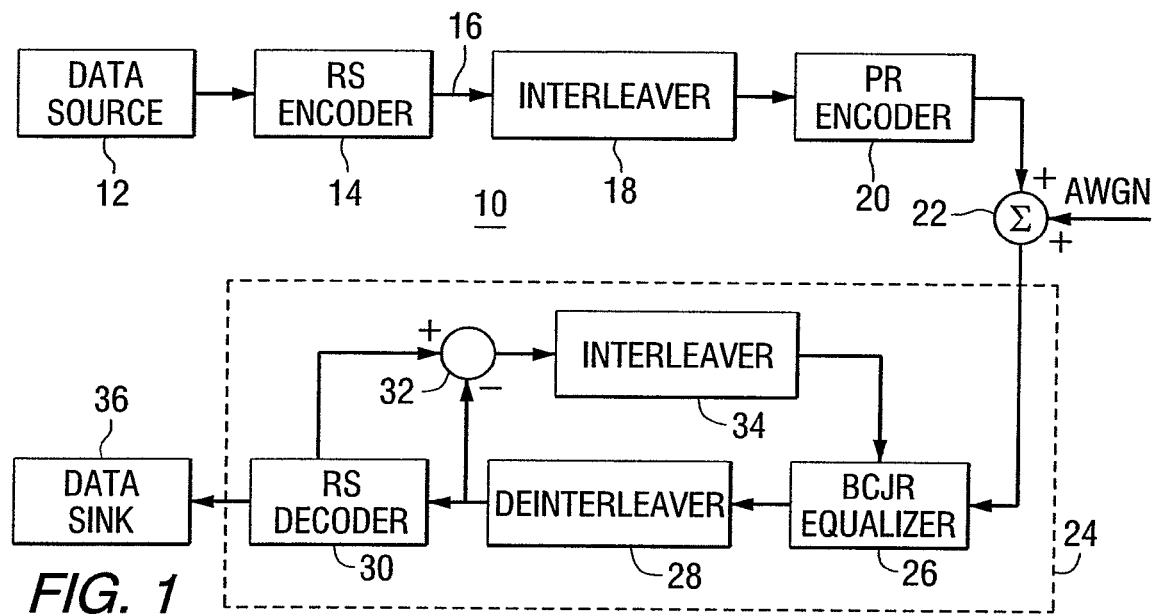
FIG. 1 is a block diagram of a system that can use the method of this invention.

A more particular description of the invention, briefly summarized above, may be had by reference to the embodiments thereof which are illustrated in the drawings and described herein. It is to be noted, however, that the drawings illustrate only some embodiments of the invention and are therefore not to be considered limiting of its scope, because the invention may encompass other embodiments. Any references to an "algorithm" in the following pages should be understood to mean a system and method of using the mentioned algorithm.

Efficient SISO decoding algorithms for RS codes of practical rate and length, e.g., RS(255,239), remains an open problem. However, this invention provides a good performance-complexity trade-off for medium to long length RS codes of half to high rate. The method of the invention also generates high quality soft outputs, which makes it of both theoretical and practical interest.

FIG. 1 is a block diagram of a recording system 10 that uses Reed Solomon outer codes and can use the decoding method of this invention. A data source 12 provides a series of data bits to a Reed Solomon encoder 14. Encoded bits on line 16 are interleaved as illustrated by block 18 and the interleaved bits are subjected to partial response (PR) encoding as illustrated by block 20. The resulting encoded bits are subject to noise, which in this example is additive white Gaussian noise as illustrated by summation point 22. The signal passes to a RS coded turbo equalization system 24, where it is equalized in the equalizer 26 and the soft decisions are deinterleaved as illustrated by block 28. The deinterleaved soft decisions are passed to a Reed Solomon decoder 30 and are also combined with the soft output from the Reed Solomon decoder in summation point 32 to produce a feedback signal that is interleaved as illustrated by block 34 and used by the equalizer. The hard decision bits output from the Reed Solomon decoder are delivered to a data sink 36.

We will discuss the binary image of the parity check matrix of the RS code in a bit of detail and then explain the invention. Consider a narrow sense RS code over GF $(2^m)$, $n=2^m-1$, which has a minimum distance $\delta=n-k+1$. The parity check matrix can be represented by:

$$H_{2^m} = \begin{bmatrix} 1 & \beta & \cdots & \beta^{(n-1)} \\ 1 & \beta^2 & \cdots & \beta^{2(n-1)} \\ \cdots & \cdots & \cdots & \cdots \\ 1 & \beta^{\delta-1} & \cdots & \beta^{(n-1)(\delta-1)} \end{bmatrix}$$

Let $\beta$ be a primitive element in GF($2^m$). All the $2^m$ elements in GF($2^m$); 0, 1, $\beta$, $\beta^2$, ..., $\beta^{2^m-2}$, can be represented using binary vector expansions in GF(2). The summation operation in GF($2^m$) is nothing but a component-wise vector summation in GF(2). Similarly, each entry in the parity check matrix $H_{2^m}$ can be replaced by an m×m matrix over GF(2) for the purpose of multiplication. Consider, for example, an RS code over GF(4) and let $\beta$ be a root of the primitive polynomial $p(x)=x^2+x+1$. $\beta$ has the binary vector expansion [0,1] and the multiplication operation ×$\beta$ corresponds to the binary multiplication of the vector expansion with a multiplication matrix $$\times \begin{pmatrix} 0 & 1 \\ 1 & 1 \end{pmatrix},$$

and etc. Hence, $H_{2^m}$ has an equivalent binary image expansion.

Hence, $H_{2^m}$ has an equivalent binary image expansion. Let H represent this (n−k)m×nm binary parity check matrix. Therefore, the parity check matrix and all the codewords have equivalent binary image forms and consequently, the RS decoding problem turns into a general problem of binary linear block code decoding.

Let $c=[c_1, c_2, \ldots, c_{nm}]$ be the binary representation of an RS codeword. Bold face letters are used to denote vectors and matrices. We assume that the bits are modulated using BPSK (with 0 mapped to +1 and 1 mapped to −1) and transmitted over an AWGN channel so that the received vector is given by $$y=(-1)^c+n.$$

The reliability of the received vector can be expressed in terms of their log-likelihood ratios (LLR) $L(c_i)$ of the bits in c $$L(c_i) = \log \frac{P(c_i = 0 \mid y_i)}{P(c_i = 1 \mid y_i)}.$$

The magnitude of $L(c_i)$, $|L(c_i)|$ denotes how reliable the decision on $c_i$ is and is referred to as the reliability of $c_i$. A bit is said to be unreliable if $|L(c_i)|$ is small.

Figure 2:
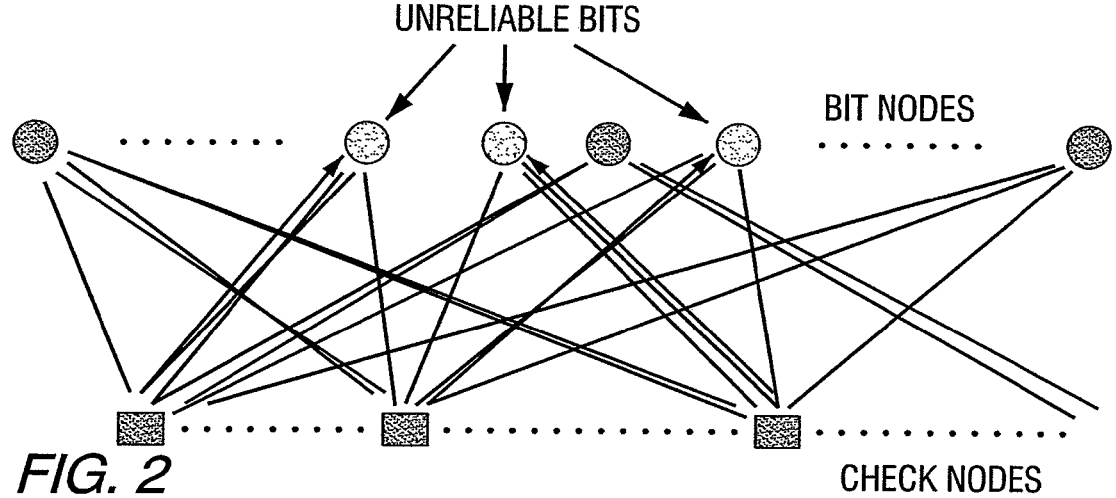
FIG. 2 is a schematic representation of the adaptive decoding procedure.

Most popular decoding algorithms for RS codes, such as the Berlekamp Massey decoder, exploit the structure of the parity check matrix at the non-binary level. However such algorithms are not able to take advantage of soft decisions efficiently as discussed earlier. An alternative approach to existing RS soft decision decoding methods is iterative message passing decoding, which currently attracts great research interest. The idea is to associate a bipartite graph with the parity check matrix as shown in FIG. 2. There are two kinds of nodes in the graphs—bit nodes and check nodes. The bit nodes represent the coded bits $c_i$ and the check nodes represent the parity checks that the bit nodes participate in. An edge in the graph between a bit node and a check node refers to the fact that that bit node participates in that parity check. In the decoding algorithm, messages are passed between the check nodes and bit nodes along the edges connecting the bit nodes and check nodes. The messages are quantities related to the probability that a particular bit is a one or zero (or, equivalently, the LLR) and are updated based on the other messages and the parity check constraints imposed by the code. One round of messages passed between the bit nodes and the check nodes constitutes one iteration. As the iterations proceed, the LLRs of the $c_i$'s are updated with the messages from the check nodes to the bit nodes (this is explained in a bit more detail later on).

It is well known that such an iterative message passing algorithm works well if the underlying parity check matrix is sparse. The parity check matrix for a linear block code may not be sparse in general and, hence, the above algorithm may not work well. Some research work on iterative decoding of general binary linear block codes has focused on the construction of proper parity check matrices, since the performance of iterative decoding will be different with the choice of parity check matrix even if the code is the same. Others have suggested using minimum weight parity check sets to propose iterative decoding and interpreting the decoding procedure as gradient optimization. However, in general, finding the minimum weight parity check sets is NP-complete. Moreover, for an RS code, which is maximum distance separable (MDS), we cannot find a sparse parity check matrix. Since the parity check matrix is nothing but the generator matrix of the dual code, which is also an MDS code, the minimum weight of every parity check must be at least k+1. Thus for high rate RS codes, where k is large, the parity check matrix is necessarily non-sparse thus making it difficult to be decoded via iterative decoding.

Others have proposed a "generalized belief propagation (GBP)" algorithm, which introduces hidden states in the iterative decoding to help improve the performance. However, even that algorithm has trouble in decoding HDPC codes when used over AWGN channels since the problem of strong correlation between unreliable bits is made worse by introducing hidden states.

So far, iterative decoding has not been very successful when applied to decoding RS codes. We observed through simulations that iterative decoding fails mainly due to some of the unreliable bits "saturating" most of the checks. That is, when two or more edges connected to a check node in the graph carry messages with very low magnitude, then all the extrinsic messages transmitted along the edges from the check node become really small or, equivalently, the iterative procedure does not proceed. We call such a check node as being 'saturated'. Our invention is based on the observation that the reason for iterative decoding not working well on high density parity check matrices is that even a few unreliable bits in the received signal are enough to saturate all the parity checks due to the high density (non sparse nature) of the parity check matrix.

EXAMPLE 1

Consider a (7,4) Hamming code where the transmitted codeword is c=[0 1 0 1 1 0 0] and the received vector is r=[1.1 −0.6 −0.1 −1.4 −1.2 −0.1 −0.1]. The parity check matrix is $$H = \begin{bmatrix} 0 & 1 & 0 & 1 & 0 & 1 & 1 \\ 1 & 0 & 1 & 0 & 0 & 1 & 1 \\ 0 & 1 & 1 & 0 & 1 & 0 & 1 \end{bmatrix}.$$

In this case, the third, sixth and seventh bits are bits corresponding to the least three magnitudes of $L(c_i)$ and, hence, are unreliable. This saturates the entire parity check matrix, meaning each row (check node) will have at least two unreliable bits and, hence, all the checks will become useless. Hence, the iterative algorithm will not proceed, meaning the extrinsic messages passed will all be of very small magnitude and will not get updated significantly.

To overcome this problem, we exploit the fact that the parity check matrix associated with a code is not unique. Note that any linear combination of the rows of the parity check matrix results in another valid parity check matrix. However, the performance of iterative decoding for a given received word will be different depending on which parity check matrix is used. Specifically, for a given received word, the unreliable bits (bits with low log-likelihood ratio observed from the channel), may saturate all the check nodes with one parity check matrix, whereas, it will not with another parity check matrix. Consider Example 1 with the same received signal, but now we use row operations to reduce the parity check matrix to what is given below $$H = \begin{bmatrix} 1 & 1 & 1 & 1 & 0 & 0 & 0 \\ 1 & 1 & 0 & 0 & 1 & 1 & 0 \\ 1 & 0 & 0 & 1 & 1 & 0 & 1 \end{bmatrix}.$$

It can be seen that there is exactly one unreliable bit in each check (each row) and, hence, the checks are not saturated as in Example 1.

An equivalent way to think about is that we want to avoid any loops among bits with small reliability. In the example in FIG. 2, one can see loops within the set of unreliable bits. For a given set of unreliable bit positions, we can adapt the parity check matrix such that there are no loops among the least reliable positions. So, the main idea is to adapt the parity check matrix to the received word and further to adapt the parity check matrix as the iterations progress. In the above example, note that here the submatrix corresponding to bits 3, 6, and 7 is the identity matrix and hence they do not participate in any loops. Thus each check has only one unreliable bit which can be determined through the check node update and, hence, the extrinsic messages evolve rapidly in the iterative algorithm. To continue further, we adapt the matrix from one iteration to another since the message passing algorithm could have made some of the unreliable bits to become reliable. Hence, the adaptation is based on the sum of the LLRs from the channels and the messages produced during the updating procedure. Since the message produced is not a true extrinsic message, we scale the message produced by a small scaling constant before adding it to the LLRs from the channel. This procedure is explained in more detail below.

The magnitude of the received LLRs $|L(c_i)|$ are first sorted and let $i_1, i_2, \ldots, i_j, \ldots, i_{nm}$ denote the position of the bits in terms of ascending order of $|L(c_i)|$. That is, the bit $c_{i_1}$ is the least reliable and $c_{i_{nm}}$ is the most reliable based on L. The method tries to reduce the parity check matrix H through row operations to a form where it is sparse over the submatrix corresponding to some of the less reliable bits.

We begin with the original parity check matrix H and first reduce the $i_1^{th}$ column of H to a form $[1\ 0\ \ldots\ 0]^T$. Then, we try to reduce the $i_2^{th}$ column of H to a form $[0\ 1\ \ldots\ 0]^T$ and so on. We can be guaranteed to proceed until the $i_{n-k}^{th}$ column, since there are at least (n−k) independent columns in H. Then we try to reduce the $i_{n-k+1}^{th}$ to $$[\underbrace{0\ldots 0}_{n-k}, 1, \ldots, 0]^T.$$

However, there is no guarantee we can do this. If so, we try to reduce the $i_{n-k+2}^{th}$ column to the above form and so on. Finally, we can reduce (n−k)m columns among the nm columns of H to be the identity matrix, since the matrix is (n−k)m×nm and is full rank. In other words, we try to choose these (n−k)m columns to correspond to the least reliable bits. If that is not possible for some specific position, we skip that bit and go on to the next unreliable bit. Let $S_L$ denote the set of column positions that have been reduced to an identity matrix. Note that $i_1, i_2, \ldots, i_{n-k}$ are guaranteed to be in this set.

Figure 3:
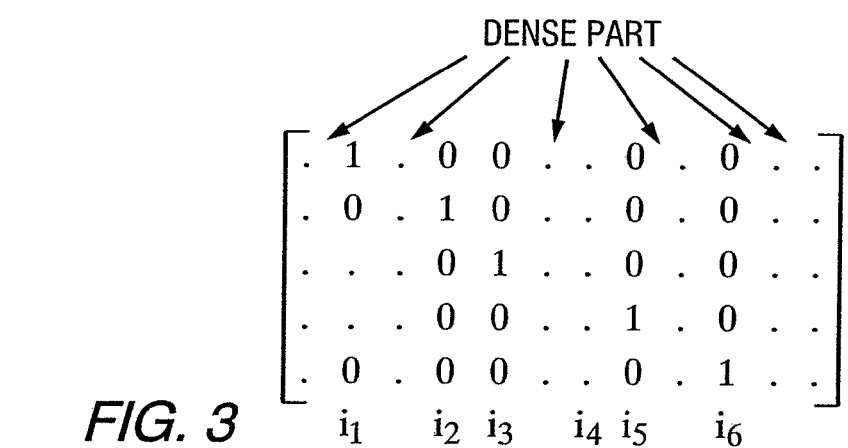
FIG. 3 is an illustration of a matrix that is suitable for iterative decoding.

The matrix is thus reduced to a form as shown in FIG. 3. The advantage of reducing H to this form is that, the bits that correspond to the identity submatrix do not participate in any loops and by choosing these to be the less reliable bits, we can prevent the iterative decoding algorithm from getting stuck. We denote the set of bits which correspond to the identity submatrix as $B_L$. Given a certain L and H, the process of reducing H is deterministic and can be represented as a function $\phi(H_1, |L|)$. During the $j^{th}$ iteration, the sum product algorithm (SPA) is implemented on the vector $L^{(j)}$ to produce extrinsic information $$L_{ext}^{(j)}.$$

The LLR $L^{(j+1)}$ is then updated according to:

$$L^{(j+1)} = L^{(j)} + \alpha L_{ext}^{(j)}$$

where $0 < \alpha \leq 1$ is a damping coefficient. Define $\psi(H,L)$ as a function that represents one iteration of the SPA algorithm which produces extrinsic information $L_{ext}$ with the input LLR L and the adapted parity check matrix H.

The proposed algorithm is iterative, and during the $j^{th}$ iteration we have a vector of LLRs $L^{(j)}$ (initially $L^{(0)}$ is determined from the channel output). During the $j^{th}$ iteration, the parity check matrix is reduced to a desired form based on $L^{(j)}$, that is, $$H^{(j)} = \phi(H, |L^{(j)}|).$$

The vector $L^{(j)}$ is updated to $L^{(j+1)}$ using the iterative decoding algorithm based on $H^{(j)}$. That is $$L_{ext}^{(j+1)} = L^j + \alpha\psi(H^{(j)}, L^{(j)}),$$

where $0 < \alpha \leq 1$ is a damping factor. This is continued for a predetermined number of times $j_{max} = N_1$ or until all the parity checks are satisfied.

This algorithm can be implemented using the sequence of steps given below:

Step 1. Initialization: set $\alpha$, $j_{max} = N_1$, $j=0$ and the coded bits LLR as observed from the channel (or directly from the frontend if in a concatenated system)

$$L^{(0)}(c_i) = \frac{2}{\sigma^2} y_i.$$

Step 2. Reliability based parity check matrix adaptation:

First, order the coded bits according to the absolute value of the LLRs $|L^{(j)}|$ and record the ordering indices.

Second, implement Gaussian elimination to systematize the (n−k)m unreliable positions which are independent in the parity check matrix. This makes an (n−k)m×(n−k)m submatrix to be the identity matrix. The submatrix does not have to be the identity matrix and a variation of this scheme is shown later.

$$H^{(j)} = \phi(H, |L^{(j)}|).$$

Step 3. APP Decoding Algorithm: Feed the LLRs into the decoder and generate extrinsic LLRs for each bit using APP decoding based on the adapted parity check matrix $$H^{(j)}: L_{ext}^{(j)} = \psi(H^{(j)}, L^{(j)}).$$

Step 4. Parameter update: Update the LLR of each bit:

$$L^{(j+1)}(c_i) = L^{(j)}(c_i) + \alpha L_{ext}^{(j)}(c_i).$$

The damping coefficient $0<\alpha\leq 1$ is used to control the step width.

Step 5. Hard Decision:

$$\hat{c}_i = \begin{Bmatrix} 0, L^{(j+1)}(c_i) > 0; \\ 1, L^{(j+1)}(c_i) < 0 \end{Bmatrix}.$$

Step 6. Termination Criterion: If all the checks are satisfied, stop iteration and output the estimated bits, else if $j=j_{max}$ (maximum number of iterations), declare a decoding failure; otherwise set $j \rightarrow j+1$ and go to Step 2 for another iteration.

Step 2 is the main novelty in the proposed algorithm. In conjunction with steps 3 and 4, this presents an alternative way for SISO decoding of any linear block codes and is particularly very effective on codes with high density parity check codes such as Reed Solomon codes. Updating the parity check matrix is crucial to the good performance of the algorithm and provides large gains over applying iterative decoding with a fixed parity check matrix as is normally done.

The method of the present invention has several advantages over existing soft decoding techniques. For example, most algebraic soft input hard output decoding methods are either too complex to implement or have only marginal gain. Moreover, soft input hard output decoders cannot generate soft output directly. Trellis based decoders, another existing technique, have exponentially increasing complexity. Finally, iterative decoding algorithms do not work for long codes, because the parity check matrices of RS codes are not sparse. This algorithm outperforms several known popular soft decision decoding algorithms for RS codes both in terms of frame error rate for a given SNR and in terms of lower computational complexity.

In one embodiment, this invention can be used to decode RS codes over GF ($2^m$), which is most commonly used. However, the method is not limited to GF ($2^m$), and may be extended to arbitrary GF(q). This can be done by replacing the binary parity checks with non-binary ones and using a parity check matrix over GF(q) instead of the binary parity check matrix.

Several variations to the described algorithm are possible.

Variation 1: If the bits in $B_L$ participate in only one check, they receive extrinsic information from only one check. To prevent this, we can reduce the matrix H to a form where the submatrix corresponding to the less reliable bits have a sparse graph (say 2 ones in each column instead of only one 1). This can improve the performance since each less reliable bit now receives more extrinsic information while the submatrix corresponding to the unreliable bits still retains a sparse nature. We can obtain this via a degree-2 random connection algorithm. This appears to improve the performance of the proposed algorithm especially at high SNRs.

Variation 1 can be implemented using the following steps.

Step 1. Initialization: Use Gaussian elimination on the original parity check matrix and obtain the identity in the unreliable part.

Step 2. Generate a random permutation of numbers from 1 to nm. Record all the indices, i.e., $p_1, p_2, p_3, \ldots, p_{nm}$.

Step 3. Adapt the parity check matrix according to the follow rule: add the $p_{i+1}^{th}$, row to the $p_i^{th}$ row until i=(n-k) m-1.

Step 4. Consequently, all the (nm-1) positions in the parity check matrix are of degree-2 except the $i_{p_1}^{th}$ column. Arbitrarily add it to some other row or just leave it to be degree-1 (which will not significantly affect the performance). Thus, we get a sparse submatrix rather than an identity in the unreliable part of the parity check matrix.

Variation 2: Another variation runs the algorithm with a different grouping of less reliable bits. It is possible that some bits with $|L(c_j)|$ close to those in the set $B_L$ are also of the wrong sign and vice-versa. Hence, we can run the algorithm several times, each time with a different grouping of the less reliable bits. That is, we can swap some bits from the reliable part with those in the unreliable part giving a new H. This provides the effect of diversity but also increases computational complexity. Each time the algorithm is run, a different estimate of the codewords can be obtained. In this case, we can choose the one that minimizes Euclidean distance from the received word. This can be performed a maximum of $N_2$ times, each time with an exchange of several bits in the boundary and thus a different adapted parity check matrix H.

Variation 3: In each iteration, the hard decision decoding part can be substituted with a hard decision RS decoder based on the Berlekamp Massey algorithm. This can accelerate the convergence of the decoding process and hence the complexity can be reduced. On the other hand, after hard decision decoding, even if we find a valid codeword, we can still iterate up to a maximum number of iterations and finally choose the codeword that minimizes squared Euclidean distance. This further improves the performance.

Variation 4: The complexity in the iterative decoding part can be further reduced via a partial updating scheme. The basic idea is that, in the proposed iterative decoding algorithm, the main complexity comes from the computation of extrinsic information in the reliable part (where the submatrix is of high density). However, in the adaptation of the parity check matrix, only part of bits in the boundary will be affected (i.e., switched from the reliable part to unreliable part). Consequently, we can just update the unreliable bits together with a fraction of the reliable bits in the boundary and thus greatly reduce the complexity while retaining most of the performance gain.

Variation 5: In a hardware realization, algorithms are usually implemented in parallel. Consequently, Gaussian elimination, which involves serial computation, is less favorable. However, particular structures of RS codes can help to overcome this drawback, by adapting the parity check matrix at the symbol level.

The detailed procedure is as follows: let $S_L=\{i_1, i_2, \ldots, i_{n-k}\}$ be the set of (n-k) least reliable symbols. We first compute symbol-level reliabilities from the bit level reliabilities. Then, the submatrix corresponding to the symbols in $S_L$ is reduced to the identity matrix over GF($2^m$). This step can be accomplished without Gaussian elimination as follows. Note that each row of the parity check matrix is a valid codeword of the dual of the RS code. Hence, in order to find a parity check matrix which has an identity submatrix, we need to determine a set of n-k codewords of the dual of the RS code such that the $j^{th}$ codeword has a one in the $i_j^{th}$ position and zeros in the $i_1, i_2, \ldots, i_{j-1}, i_{j+1}, \ldots, i_{n-k}$ positions. The other k positions of course need to determined. We can think of decoding a received word which has a 1 in the $i_j^{th}$ position and zeros in the $i_1, i_2, \ldots, i_{j-1}, i_{j+1}, \ldots, i_{n-k}$ positions and erasures everywhere else using an erasures decoder for the dual code. The result will go into the $j^{th}$ row of H. Note that this step requires only the use of Forney's algorithm (which can be found in any standard text book on coding theory) to determine the erasure values. This is the required matrix which has a submatrix to be the identity part. Then, we can find the equivalent binary image and apply the invention.

Similarly, variation 1 can be implemented in conjunction with symbol-level adaptation. Unlike Gaussian elimination, the generation of the (n−k)k entries are independent of each other and thus can be implemented efficiently in parallel. This provides a computationally efficient way to obtain a parity check matrix in the desired form for hardware implementation.

The performance of the symbol-level adaptation algorithm is inferior to that of bit-level adaptation algorithm over memoryless channels (e.g., AWGN), since the channel does not have memory, and each symbol may contain both reliable and unreliable bits. Consequently, after symbol-level reliability adaptation, there may still be a large number of unreliable bits in the high density part of the parity check matrix, which may stop the iterative decoding. Nevertheless, by taking advantage of the bit-level soft information, it still provides some gain and is comparable with some SIHO algorithms such as GMD, combined Chase and GMD, or KV algorithms. More interestingly, in some situations such as a channel which exhibits fading at the symbol level, i.e., all the bits in a symbol are affected by the same fading coefficient which is independent from one symbol to another or channels corrupted by bursty errors, the symbol based adaptive scheme alone seems to provide impressive performance improvement over HDD. Heuristically, the reason is that since almost all the bits in a symbol will either be less reliable or more reliable, symbol based adaptation is enough to give good performance as long as bit-level reliability is used in the iterative decoding scheme.

Variation 6: The generic algorithm naturally provides soft output and, hence, can serve as a SISO decoder with a slight modification of the original algorithm. That is, the inputs to the decoder are obtained from the frontend SISO detector or equalizer in the concatenated system, instead of being directly observed from the channel. On the other hand, after several iterations the soft information is outputted instead of the hard decisions. Consequently, the SISO algorithm can be readily embedded in a concatenated scheme which employs turbo processing, for example, turbo equalization (TE). The TE algorithm based on this SISO algorithm for RS codes is illustrated for turbo equalization of RS codes including the following steps.

Step 1. Initialization: Set maximum turbo rounds $M_2$, M=0 and the received value as observed from the channel.

Step 2. Apply any SISO equalizer and obtain the extrinsic LLRs from the SISO equalizer.

Step 3. Interleave the extrinsic LLRs and feed them as a priori LLRs to the RS SISO decoder. Run the SISO decoder for a predetermined number $M_1$ of iterations, and generate extrinsic LLRs from the decoder.

Step 4. Make hard decisions based on the overall LLR for each bit. If the stopping criterion is satisfied, stop the iterations and output the estimated bits; otherwise deinterleave the extrinsic LLRs from the decoder, feed them as a priori LLRs to the equalizer, set M→M+1 and go to Step 2 for another TE round until M=$M_2$.

This algorithm can also be generalized to other applications such as concatenated systems, coded modulation and etc. We will see later that these SISO algorithms performs impressively both over AWGN channel and in TE systems for RS codes of practical length and rate.

The algorithm of this invention has a reasonable computational complexity. The reliability ordering and indexing process can be realized using a standard quick sort algorithm, such as "mergesort", with a complexity of o(nm log$_2$(nm)). The Gaussian elimination of the parity check matrix is achieved in o(n(n−k)$^2$m$^3$) binary operations for bit-level adaptation. For symbol-level adaptation, Gaussian elimination can be replaced with Forney's algorithm for computing the erased values. The complexity is about o(k(n−k)), while it facilitates parallel implementation. Variation 1 may further increase the complexity with the order about o(n(n−k)m$^2$). However, it can be readily implemented in parallel.

In the iterative decoding part, since the parity check matrix is of low density in the unreliable part, the complexity is about o(k(n−k)m$^2$) real additions during each iteration (assume that the function log(tanh( )) is tabulated). If a partial updating scheme is adapted, the complexity can be further reduced to be approximately o((n−k)m), which is linear in the codeword length nm. In conclusion, the overall computational complexity is in polynomial time with respect to either n or d$_{min}$. Running many iteration rounds and outer rounds expands the complexity (the complexity will be expanded $N_1 \times N_2$ times), however, we can see from the simulation results that even very few iterations produce significant improvement over hard decision decoding.

The performance of the invention and its variations has been simulated. The following notation will be used in the legends of FIGS. 4-8. ADP ($N_1, N_2$) refers to iterative decoding with variation 1 and 2. $N_1$ refers to the maximum number of iterations of iterative decoding and $N_2$ refers to the maximum number of different ordering groups chosen (for variation 2). HDD refers to variation 3 (hard decision decoding after each round). This is used mainly to speed up simulation and it also cures the error floor problem in the high SNR region. In practice, HDD can be used in a more efficient way. SYM ADP refers to the algorithm with symbol-level adaptation scheme (variation 5). RED(M) ADP refers to the reduced complexity partial updating schedule (variation 4) with M bits to be updated in the reliable part. GMD refers to generalized minimum distance decoding. KV(λ) refers to the Koetter-Vardy algorithm with maximum multiplicity number λ. Chase-GMD(d) refers to combined Chase and GMD decoding with d most unreliable symbols to be exhausted. BMA(n) refers to order "n" box and match decoding algorithm. TE($M_1, M_2$) refers to turbo equalization with $M_1$ decoding iterations and $M_2$ overall LLRs exchanging round between the SISO equalizer and the proposed decoder.

For comparison, the lower bound on the achievable FER with maximum likelihood (ML) decoding is also plotted. It is difficult to evaluate the exact performance under ML decoding. However, there is a technique to estimate a lower bound on the ML performance—when the estimated codeword returned by the proposed decoder is closer to the received vector than the transmitted codeword, an ML error is counted, otherwise it is assumed that the ML decoder does not make a mistake. Hence, this provides a lower bound on the achievable FER. This bound is tight when the performance of the proposed decoder is close to ML performance.

Note that to speed up simulation, a genie aided stop criterion scheme is assumed. i.e., the decoding procedure stops when it gives the correct codeword. It is a little bit optimistic in the sense that though the hard decision may give the "correct code", there is still some possibility that it converges to another codeword, which is ML undetectable in the following rounds. However, this kind of error is ML undetectable and takes only a very small fraction compared with proposed algorithms. In practice, error detection schemes such as CRC or other known test techniques can serve as a stopping criterion. In the TE simulation, "genie aided" stopping criterion also applies, i.e., when all bits converge to the correct value, the iteration stops.

The damping coefficient α is selected to be in a range from 0.05 to 0.25 based on simulation experience. More careful optimization of the damping coefficient and a more sophisticated updating scheme can probably further improve the performance. However, the described algorithm already performs well with a reasonable complexity.

Figure 4:
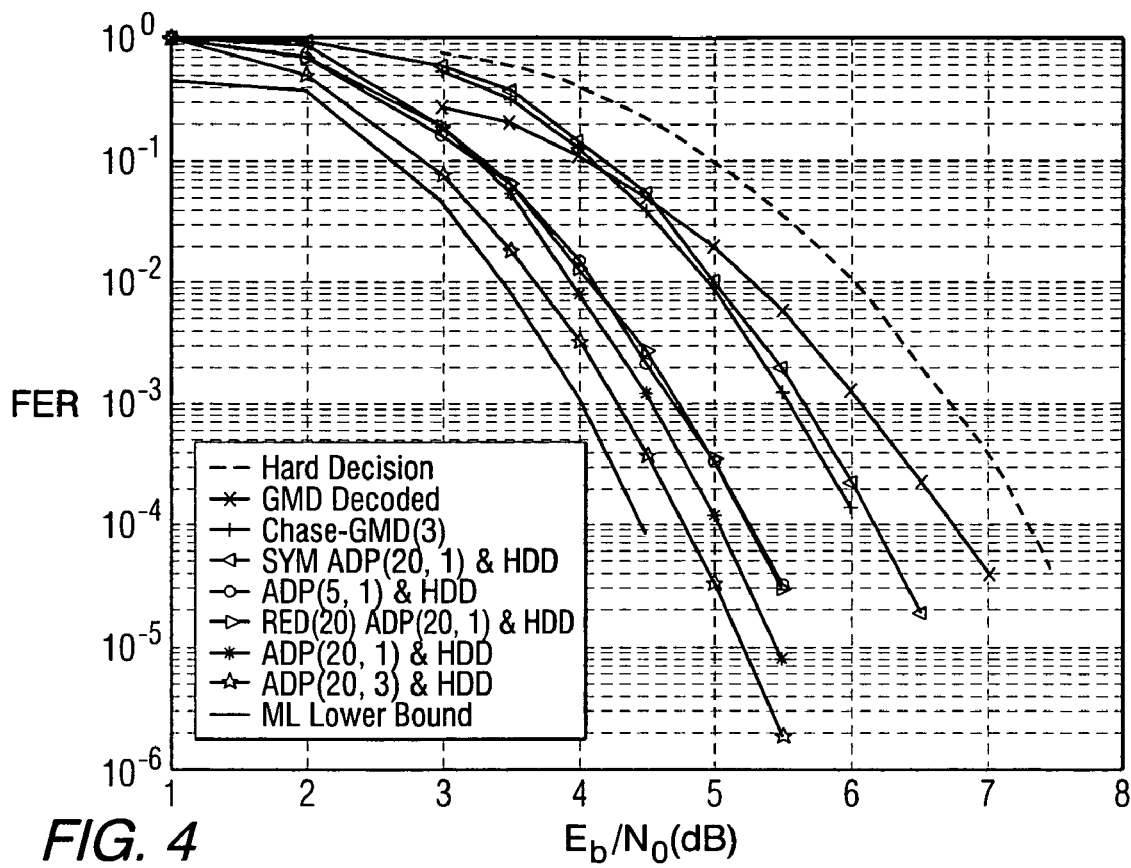
FIGS. 4, 5, 6, 7 and 8 are graphs of frame error rate (FER) versus signal-to-noise ratio.

We present results for the RS (31,25) code over the AWGN channel in FIG. 4. Several soft decision decoding methods are compared. For this code, a standard iterative decoding algorithm (either with or without the damping coefficient, which is not shown in the figure) has little gain (within 0.5 dB from algebraic HDD) due to the large number of short cycles. However, the proposed ADP(20,1) and HDD provides a 2.3 dB gain over HDD at an FER=$10^{-4}$. The proposed ADP(20,3) and HDD performs within 0.25 dB from the ML lower bound at an FER=$10^{-4}$ and outperforms HDD, GMD decoding and Chase-GMD(3) decoding, by 2.5 dB, 2.0 dB and 1.3 dB respectively. The reduced complexity version RED(20) ADP (20,1) suffers about 0.2 dB performance penalty at an FER=$3\times10^{-5}$, but greatly reduces the complexity of the generic algorithm. The performance is identical to that of ADP(5,1) at least down to FER=$3\times10^{-5}$. As for the symbol-level adaptation scheme, we see from simulation result that SYM ADP(20,1) and HDD performs comparably with Chase-GMD(3) and outperforms HDD by about 1.2dB at an FER=$4\times10^{-5}$. Consequently, the proposed algorithm can provide a wide range of complexity-performance trade-off.

Figure 5:
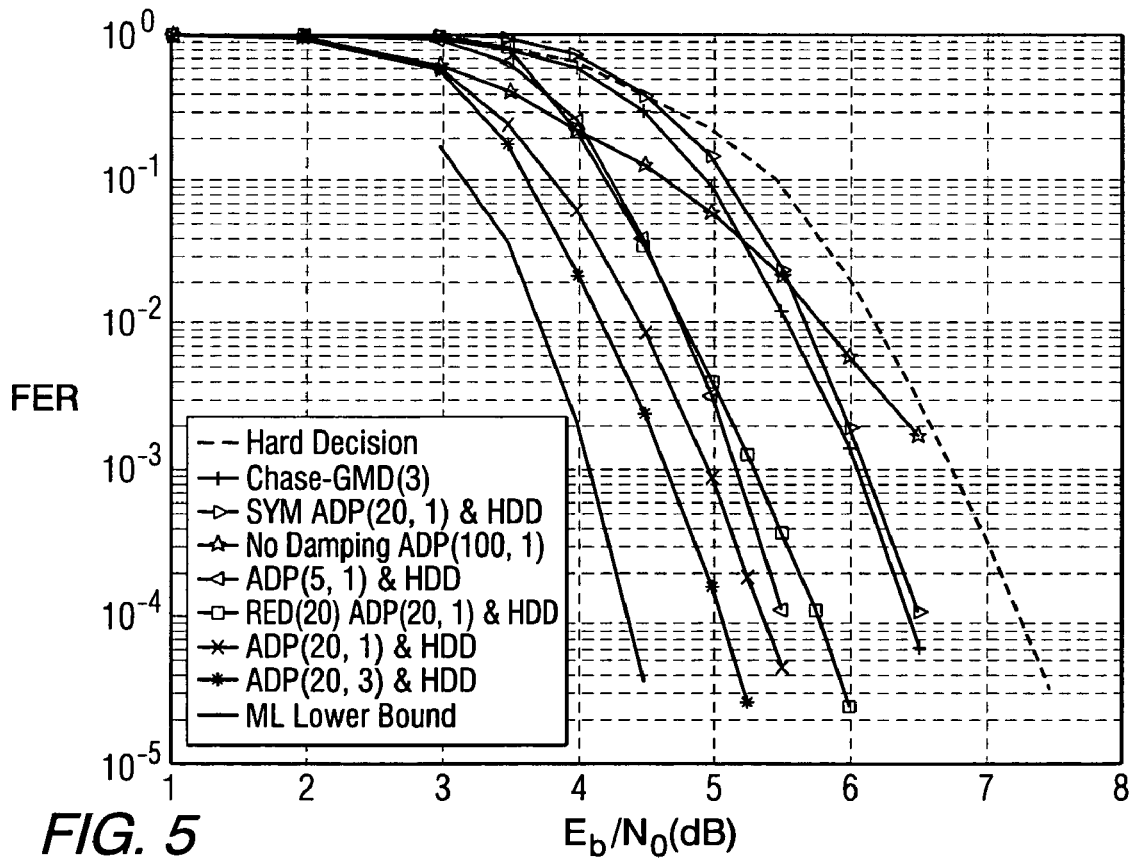
Figure 6:
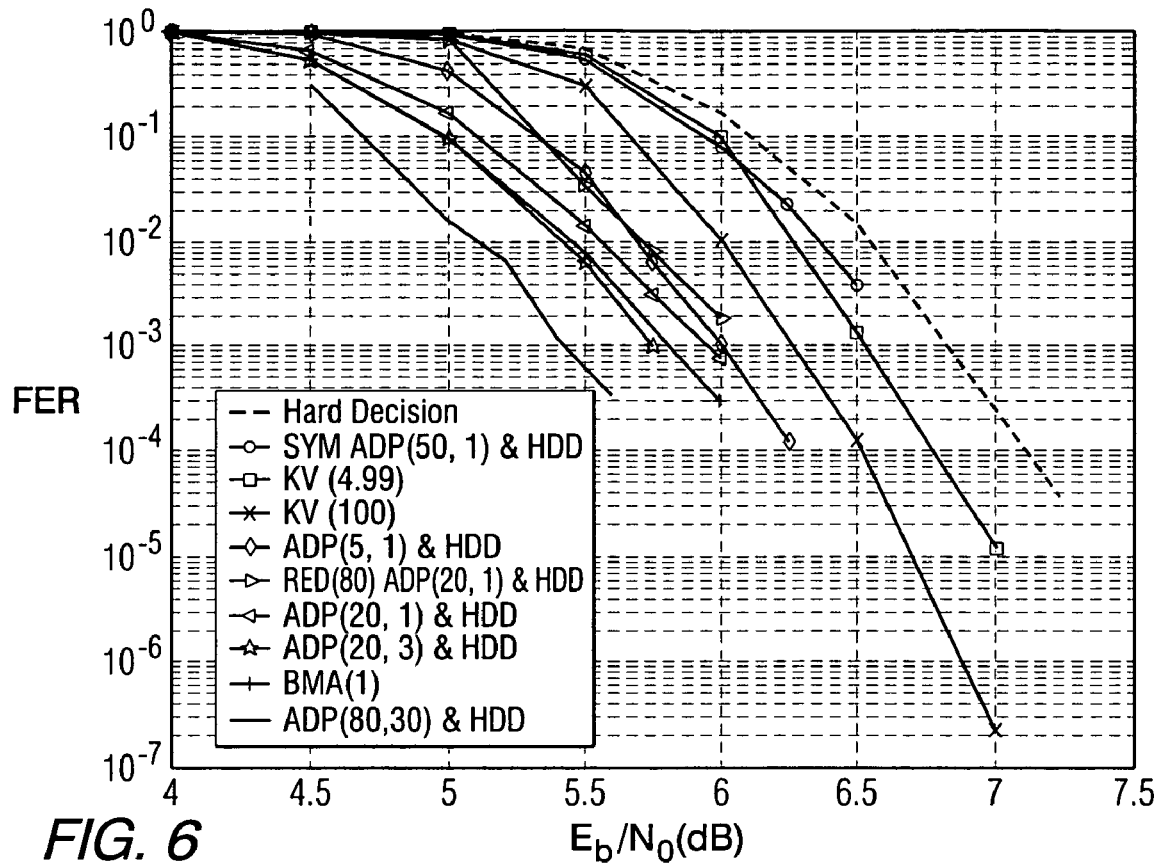

Now we consider the (63,55) RS code. The performance is shown in FIG. 5. For this code, standard iterative decoding performs even worse than hard decision decoding (not plotted in the figure). The proposed ADP(20,1) and HDD provides 1.95,dB and 1.05 dB gain over algebraic HDD and Chase-GMD(3) at an FER=$10^{-4}$. ADP(20,3) performs about 0.75 dB within the ML lower bound at an FER=$10^{-4}$. It also provides another 0.3 dB gain over ADP(20,1) and seems to have a steeper slope asymptotically. Note that the damping coefficient of the ADP must be carefully chosen to control the updating step width. As shown in the figure, the performance curve of ADP(100,1) without scaling has a small slope and the asymptotic gain diminishes, which is mainly due to the overshooting of the update scheduling such that the decoder tends to converge to a wrong codeword quickly. Results of RED(20) ADP(20,1) and HDD, and SYM ADP(20,1) and HDD are also shown in the figure for comparison, while their performances are as expected.

Others have mentioned that the decoding problem of RS codes of long length with reasonable $d_{min}$, such as RS(255, 239), remains open. Here we show some promising results for a RS(255,239) code over the AWGN channel in FIG. 6. When large complexity is tolerable, ADP(80, 30) outperforms the KV method with λ=100 by 0.8 dB, λ=4.99 by 1.05 dB and algebraic HDD by 1.35 dB, respectively, at an FER=$3\times10^{-4}$. We also compare this algorithm with BMA order-1. ADP is also about 0.4 dB better than BMA order-1 at an FER=$3\times10^{-4}$. Unfortunately, we are unable to get the ML lower bound, which suggests that the proposed decoder could still be much inferior to ML decoder. For the reduced complexity scheme, ADP(5,1) and HDD, and RED ADP(20,1) and HDD, have significantly smaller complexity than the KV(256) and the BMA(1), while still providing comparable performance. SYM ADP(50,1) provides about 0.15 dB gain over hard decision decoding at an FER=$10^{-2}$. Note that for this code, even the KV decoder with huge complexity provides only a marginal gain, while BMA and bit-level ADP works well down to FER=$10^{-4}$, which may suggest that taking advantage of bit-level soft information can exploit the error correction capability of RS codes more efficiently.

Figure 7:
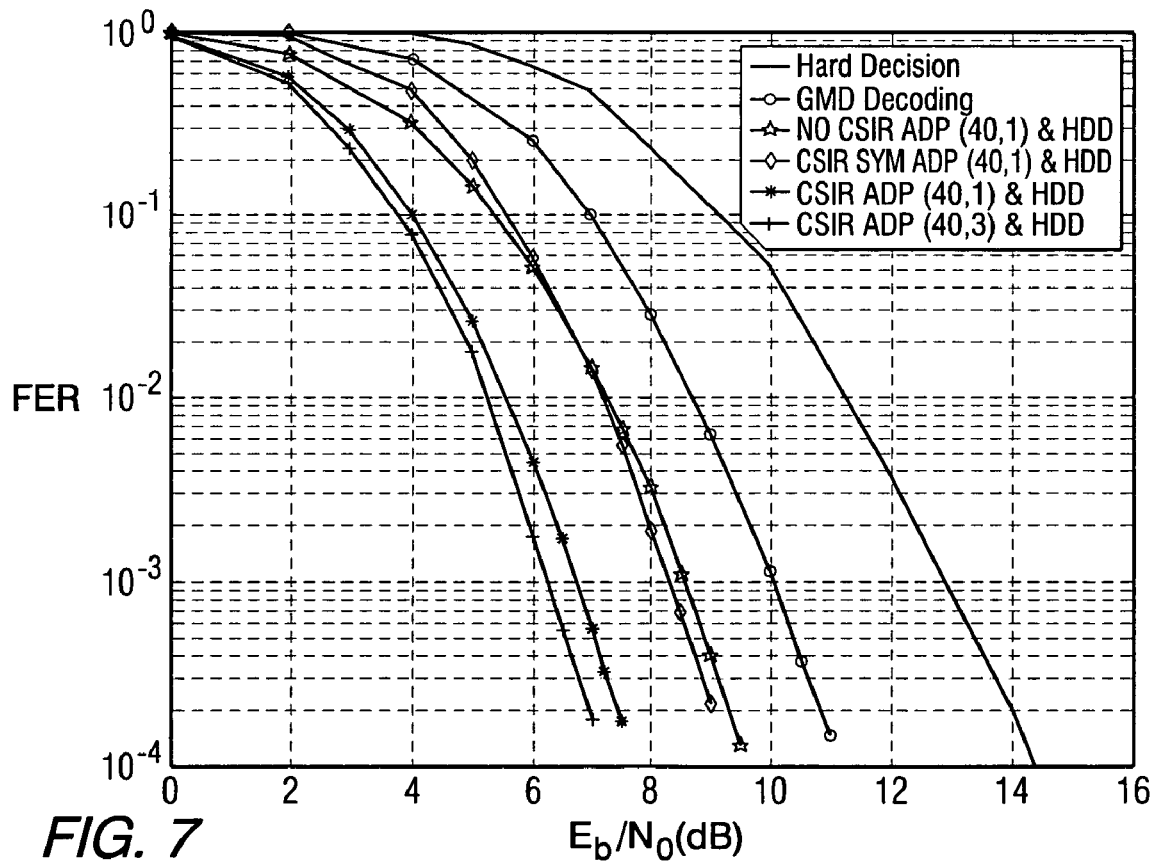

The performance of proposed iterative decoding of RS codes over a symbol-level fully interleaved Rayleigh fading channel has also been evaluated. It is assumed that there is perfect channel state information (CSI) at the receiver. The performance for a RS(31,15) code is shown in FIG. 7. The proposed algorithm ADP(40,1) and HDD outperforms algebraic HDD and GMD decoding by 6.5 dB and 3.3dB respectively at an FER=$10^{-4}$. The gain is expected to be larger as the curve of HDD has a flatter slope asymptotically ADP(40,3) and HDD can further improve the asymptotic performance. SYM ADP(40,1) and HDD is also plotted. We see that it also offers about 5 dB gain over HDD and 1.8 dB gain over GMD decoding respectively at an FER=$10^{-4}$. This is a nontrivial gain compared with the powerful RS hard decision decoders over the symbol-level interleaved slow fading channel.

Figure 8:
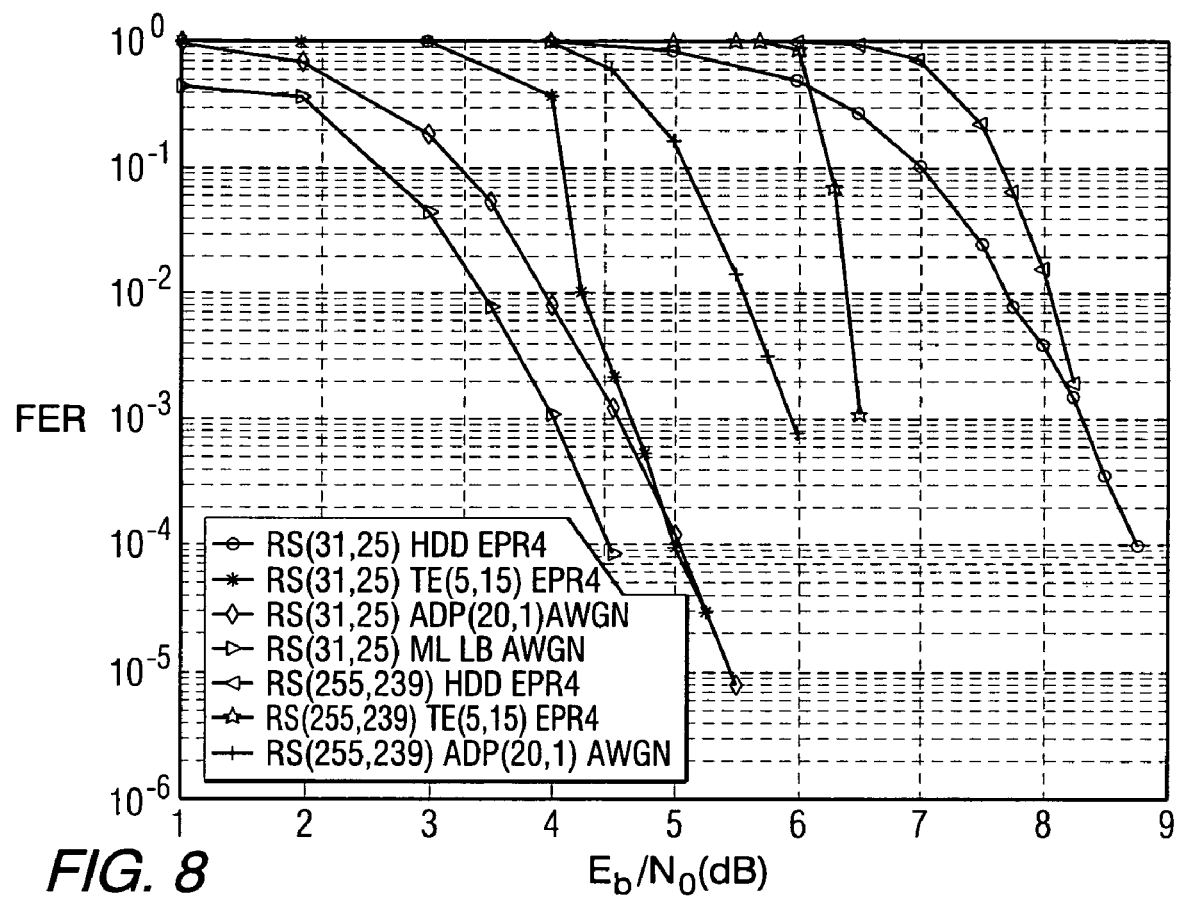

The invention can be applied to magnetic recording channels. The performance of a receiver employing turbo equalization (TE) based on the proposed SISO algorithm over an extended partial response 4 (EPR4) channel is shown in FIG. 8. The overall block length is approximately 20,000 bits and the bits are fully interleaved such that incoming messages can be assumed to be independent for the outer RS decoder. More noticeable performance gain is obtained over a channel with inter-symbol interference (ISI). The TE(5,15) for RS(31,25) code is shown in the figure. The performance curve shows an evident cliff region at $E_b/N_0$=4 dB and the performance in the high SNR region is almost identical with the results of ADP (5,1) and HDD over AWGN channel, which suggests that the proposed TE scheme is able to completely remove the effects of ISI. It provides about 3.5 dB gain over direct BCJR equalization and algebraic HDD, and is within 0.5 dB from the ML lower bound over AWGN channel at an FER=$10^{-4}$. Good results are also obtained for the RS(255,239) code. TE(5,15) provides 1.8 dB improvement over direct detection and hard decision decoding and is only 0.5 dB inferior to the performance of ADP(5,1) and HDD over AWGN channel at an FER=$10^{-3}$. Limited by the power of computer simulation, we were unable to simulate down to even lower FER to see whether it can converge to the performance curve over AWGN channels at high SNR region.

This invention provides an iterative soft decoding scheme for general linear block codes where the parity check matrix is adapted depending on the received signal and the messages passing during the message passing algorithm. We have shown that a properly scheduled algorithm outperforms known RS code soft decoding methods and approaches ML decoding for medium length high rate codes. The computational complexity of this new method increases only polynomially with respect to either codeword length n or the minimum distance $d_{min}$ and also offers a flexible performance-complexity trade-off for different applications.

Moreover, the invention can efficiently generate soft outputs, which can be utilized in "turbo equalization" in application scenarios such as concatenated systems or channels with memory. Simulation results show that the proposed SISO decoder performs well not only over AWGN and fading channels, but in the TE system over EPR4 channels as well. The scheme can be widely used in receiver designs of existing systems to fully exploit the error correction capability of RS codes.

The method of this invention can be performed in an apparatus having an input for receiving a data signal including linear block coded data, and a decoder using an iterative message passing decoder with the binary image of the parity check matrix. The main idea is to reduce a submatrix of the binary parity check matrix to a sparse nature prior to application of the message passing algorithm in each iteration, wherein the submatrix is chosen such that it corresponds to less reliable bits in the codeword. Such an apparatus is illustrated in the block diagram of FIG. 1.

While the invention has been described in terms of several examples, it will be apparent to those skilled in the art that various changes can be made to the described examples without departing from the scope of the invention as set forth in the following claims.

What is claimed is:

1. A method of decoding linear block code, the method comprising:
    receiving a linear block code having a parity check matrix;
    decoding the linear block code to produce decision bits using an iterative message passing algorithm with a binary image of the parity check matrix of the linear block code, wherein the parity check matrix is adapted from one iteration to another based on the reliabilities of bits in the linear block code by reducing a submatrix of the binary parity check matrix to a sparse nature prior to application of the message passing algorithm; and
    outputting the decision bits produced in the decoding step.

2. The method of claim 1, wherein the submatrix is chosen such that it corresponds to less reliable bits in the linear block code.

3. The method of claim 1, wherein the submatrix is an identity matrix.

4. The method of claim 1, wherein the submatrix includes two ones in each column.

5. The method of claim 1, wherein the submatrix is reduced to a systematic form at the symbol level through the use of an erasure decoder.

6. The method of claim 1, wherein the parity check matrix includes a reliable part and an unreliable part, and wherein the iterative algorithm uses different groupings of bits in the unreliable part.

7. The method of claim 1, wherein the parity check matrix includes a reliable part and an unreliable part, and wherein the iterative algorithm updates only the unreliable part and a fraction of the reliable part.

8. The method of claim 1, wherein the parity check matrix includes a reliable part and an unreliable part, and wherein bits from the reliable part are interchanged with bits from the unreliable part.

9. The method of claim 1, wherein the linear block code comprises a Reed Solomon code.

10. An apparatus comprising:
    a decoder for producing decision bits and having an input for receiving a linear block code having a parity check matrix, the decoder processing the linear block code using an iterative message passing algorithm with a binary image of the parity check matrix of a linear block code, wherein the parity check matrix is adapted from one iteration to another based on the reliabilities of bits in the linear block code by reducing a submatrix of the binary parity check matrix to a sparse nature prior to application of the message passing algorithm; and
    an output for outputting the decision bits produced in the decoder.

11. The apparatus of claim 10, wherein the submatrix is chosen such that it corresponds to less reliable bits in the linear block code.

12. The apparatus of claim 10, wherein the submatrix is an identity matrix.

13. The apparatus of claim 10, wherein the submatrix includes two ones in each column.

14. The apparatus of claim 10, wherein the submatrix is reduced to a systematic form at the symbol level through the use of an erasure decoder.

15. The apparatus of claim 10, wherein the parity check matrix includes a reliable part and an unreliable part, and wherein the iterative algorithm uses different groupings of bits in the unreliable part.

16. The apparatus of claim 10, wherein the parity check matrix includes a reliable part and an unreliable part, and wherein the iterative algorithm updates only the unreliable part and a fraction of the reliable part.

17. The apparatus of claim 10, wherein the parity check matrix includes a reliable part and an unreliable part, and wherein bits from the reliable part are interchanged with bits from the unreliable part.

18. The apparatus of claim 10, wherein the linear block code comprises a Reed Solomon code.

* * * * *